(12) United States Patent
Wang et al.

(10) Patent No.: US 8,353,728 B2
(45) Date of Patent: Jan. 15, 2013

(54) RECEPTACLE CONNECTOR HAVING CONTACT MODULES AND PLUG CONNECTOR HAVING A PADDLE BOARD

(75) Inventors: Chien-Chiung Wang, New Taipei (TW); Xue-Liang Zhang, Kunshan (CN); Jiang-Hong Wu, Kunshan (CN); Qing-Man Zhu, Kunshan (CN)

(73) Assignee: Hon Hai Precision Ind. Co., Ltd, New Taipei (TW)

( * ) Notice: Subject to any disclaimer, the term of this patent is extended or adjusted under 35 U.S.C. 154(b) by 0 days.

(21) Appl. No.: 13/209,649

(22) Filed: Aug. 15, 2011

(65) Prior Publication Data

US 2012/0040566 A1 Feb. 16, 2012

(51) Int. Cl.
*H01R 24/00* (2011.01)
(52) U.S. Cl. .................................................. 439/637
(58) Field of Classification Search .................. 439/637, 439/636, 60, 497
See application file for complete search history.

(56) References Cited

U.S. PATENT DOCUMENTS

| | | | |
|---|---|---|---|
| 5,425,651 A | 6/1995 | Thrush et al. | |
| 6,142,802 A | 11/2000 | Berg et al. | |
| 7,198,519 B2 * | 4/2007 | Regnier et al. | 439/637 |
| 7,798,820 B2 | 9/2010 | Hong | |
| 7,833,068 B2 * | 11/2010 | Bright et al. | 439/733.1 |
| 8,162,687 B2 * | 4/2012 | Dawiedczyk et al. | 439/357 |
| 2004/0072467 A1 * | 4/2004 | Jordan et al. | 439/492 |
| 2012/0040563 A1 * | 2/2012 | Wang et al. | 439/626 |

* cited by examiner

*Primary Examiner* — Phuong Dinh
(74) *Attorney, Agent, or Firm* — Ming Chieh Chang; Wei Te Chung (57) ABSTRACT

A receptacle connector (100) and a plug connector having a paddle board (800) mate with each other along a mating direction. The receptacle connector includes a housing (1) defining a slot (224), and a pair of first groups of terminals secured in the housing and a second group of terminals. The first group of terminals includes a first terminal (221) having a first contact portion (2211) disposed at a first side of the slot (224), a second terminal (222) having a second contact portion (2221) and a third terminal (223) having a third contact portion (2231) disposed at a second side of the slot. The first contact portion is positioned between the second contact portion and the third contact portion along the mating direction. The second group of terminals include a fourth terminal (211) and a fifth terminal (212).

5 Claims, 9 Drawing Sheets

RECEPTACLE CONNECTOR HAVING CONTACT MODULES AND PLUG CONNECTOR HAVING A PADDLE BOARD

BACKGROUND OF THE INVENTION

1. Field of the Invention

The present invention relates to a receptacle connector and a plug connector, and more particularly to a SFP (Small Form-Factor Pluggable) receptacle connector and a plug connector mating with the receptacle connector.

2. Description of Related Art

U.S. Pat. No. 6,142,802 issued to Berg et al. on Nov. 7, 2000 discloses an SFP transceiver connector mating with a plug connector having a paddle board. The transceiver connector includes a housing defining a plurality of passageways, a plurality of first terminals and second terminals mounted in passageways of the housing. The paddle board is formed with a plurality of first pads and second pads. When the plug connector is inserted into the transceiver connector, the first terminals come to contact with the first pads for transmitting differential signal, power signal and grounding signal. The second terminals come to contact with the second pads for transmitting power signal and grounding signal.

U.S. Pat. No. 7,798,820 issued to Hong on Sep. 21, 2010 discloses a transceiver connector comprising an inserting slot for insertion of a card, a first and a second terminals disposed at an upper side of the insertion slot and aligned with each other along a mating direction, and a third terminal and optionally a fourth terminal disposed at a lower side of the insertion slot and aligned with each other along the mating direction. A paddle board of the mating plug has a first and a second pads disposed at the upper face and aligned with each other along the mating direction, and a third pad and optionally a fourth pad disposed at the lower face. The first through fourth terminals contact with the first through fourth pads.

U.S. Pat. No. 5,425,651 issued to Thrush et al. on Jun. 20, 1995 discloses a transceiver connector comprises an inserting slot for insertion of a card, a first terminal disposed at an upper side of the insertion slot, a second and a third terminals disposed at a lower side of the insertion slot and aligned with each other along the mating direction. A paddle board of the mating plug has a first pad disposed at the upper face, a third and a fourth pads disposed at the lower face and aligned with each other along the mating direction. The first through third terminals contact with the first through third pads.

More various arrangement of the terminals of the receptacle connector and pads on the paddle board of the mating plug are desired to meet customer's various requirement.

Hence, a receptacle connector having an improved contact module and a mating plug having a paddle board is desired.

SUMMARY OF THE INVENTION

Accordingly, an object of the present invention is to provide a receptacle connector including a contact module capable of transmitting various signals as required and a plug connector mating with the receptacle connector.

In order to achieve the object set forth, a receptacle connector mates with a plug connector along a mating direction. The receptacle connector includes a housing defining an inserting opening and a slot, a pair of first groups of terminals and a second group of terminals secured in the housing. Each first group of terminals include a first terminal having a first contact portion for transmitting differential signal disposed at a first side of the slot, a second terminal having a second contact portion for transmitting low-frequency signal and a third terminal having a third contact portion for transmitting differential signal. The second contact portion and third contact portion are respectively disposed at a second side opposite to the first side of the slot and aligned with each other along the mating direction. The first contact portion is positioned between the second contact portion and the third contact portion along the mating direction. The second group of terminals include a fourth terminal having a fourth contact portion for grounding disposed at the first side of the slot, and a fifth terminal having a fifth contact portion disposed at the second side of the slot.

The plug connector comprises a paddle board having a mating edge, a first face, a second face, a pair of first group of pads and a second group of pads. Each first group of pads includes a first pad for transmitting differential signal disposed on the first face, a second pad for transmitting low-frequency signal and a third pad for transmitting differential signal. The second and third pads are respectively disposed at the second face and are aligned with each other along the mating direction. The first pad is positioned between the second pad and the third pad along the mating direction. The second group of pads include a fourth pad for grounding on the first face, and a fifth pad having a fifth pad disposed at the second face.

The paddle board is formed with more type and more number of pads, to transmit more types of signals and establish grounding between two pairs of differential signals, without enlarging the dimension of the paddle board.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
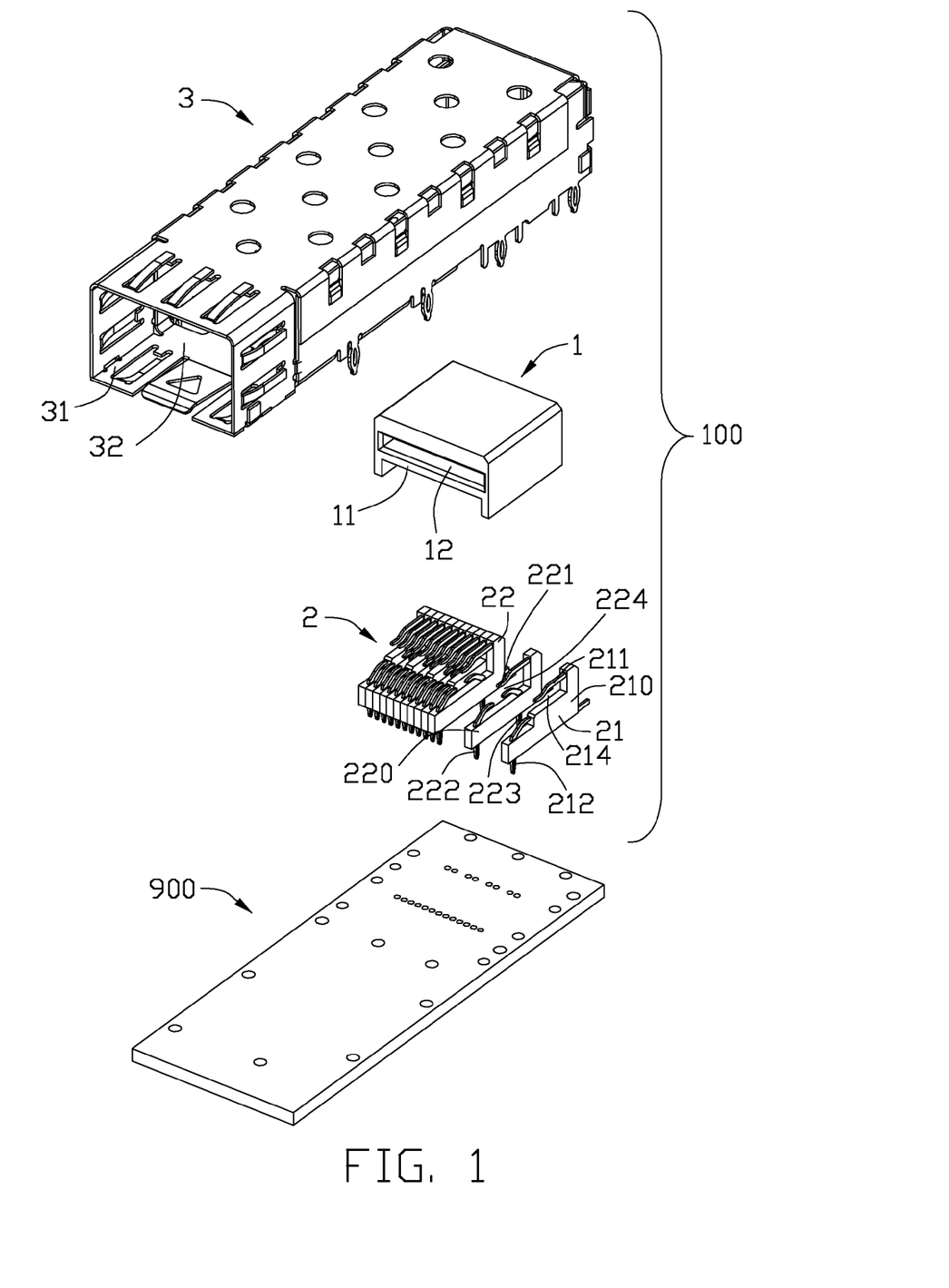
FIG. 1 is an exploded view showing a receptacle connector and a mother board in accordance with a first embodiment of the present invention.
Figure 5:
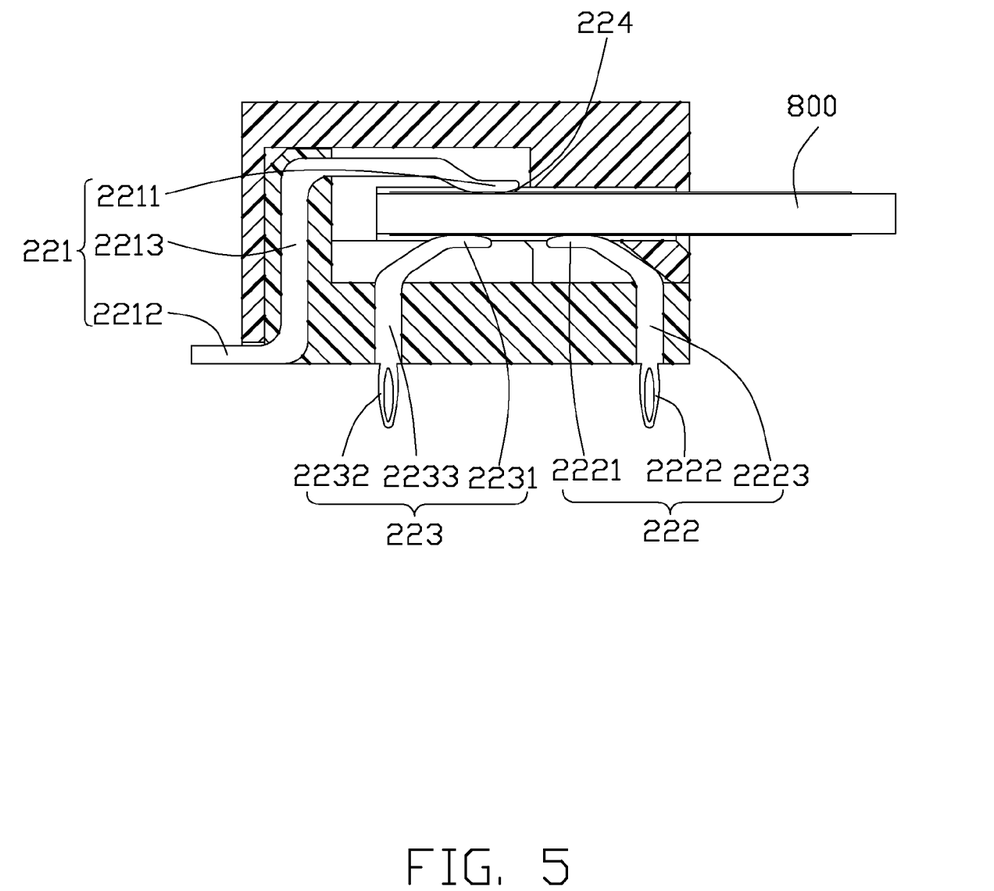
FIG. 5 is a cross-sectional view showing the first contact module in contact with the paddle board, taken along line 5-5 of FIG. 3, with a first wafer omitted.

Referring to FIGS. 1 and 5, a receptacle connector 100 in accordance with a first embodiment of the present inversion is adapted for mating with a mating connector (not shown)

having a paddle board 800. The paddle board 800 is insertable in the receptacle connector 100.

Figure 2:
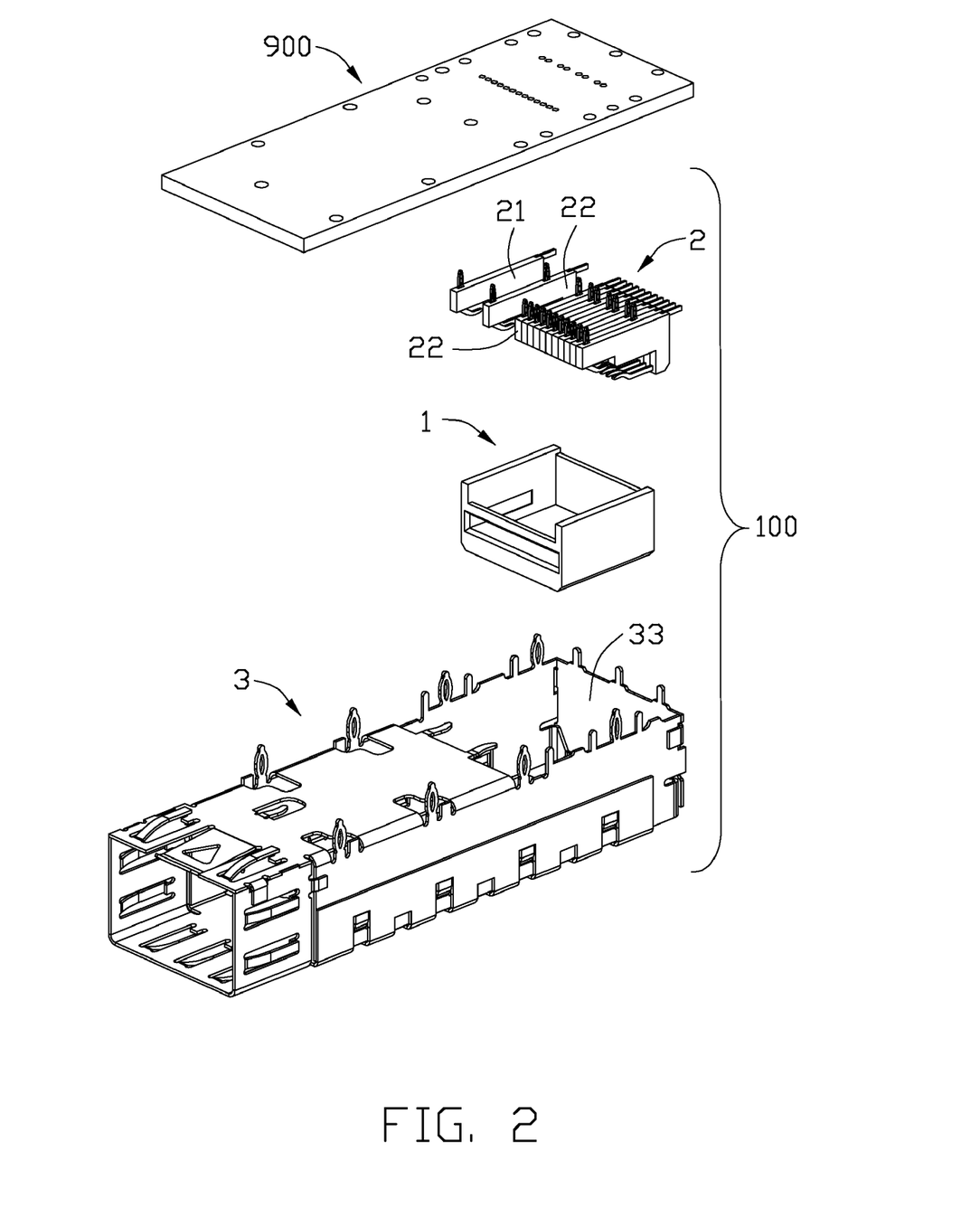
FIG. 2 is another exploded view similar to FIG. 1, taken from another aspect.
Figure 3:
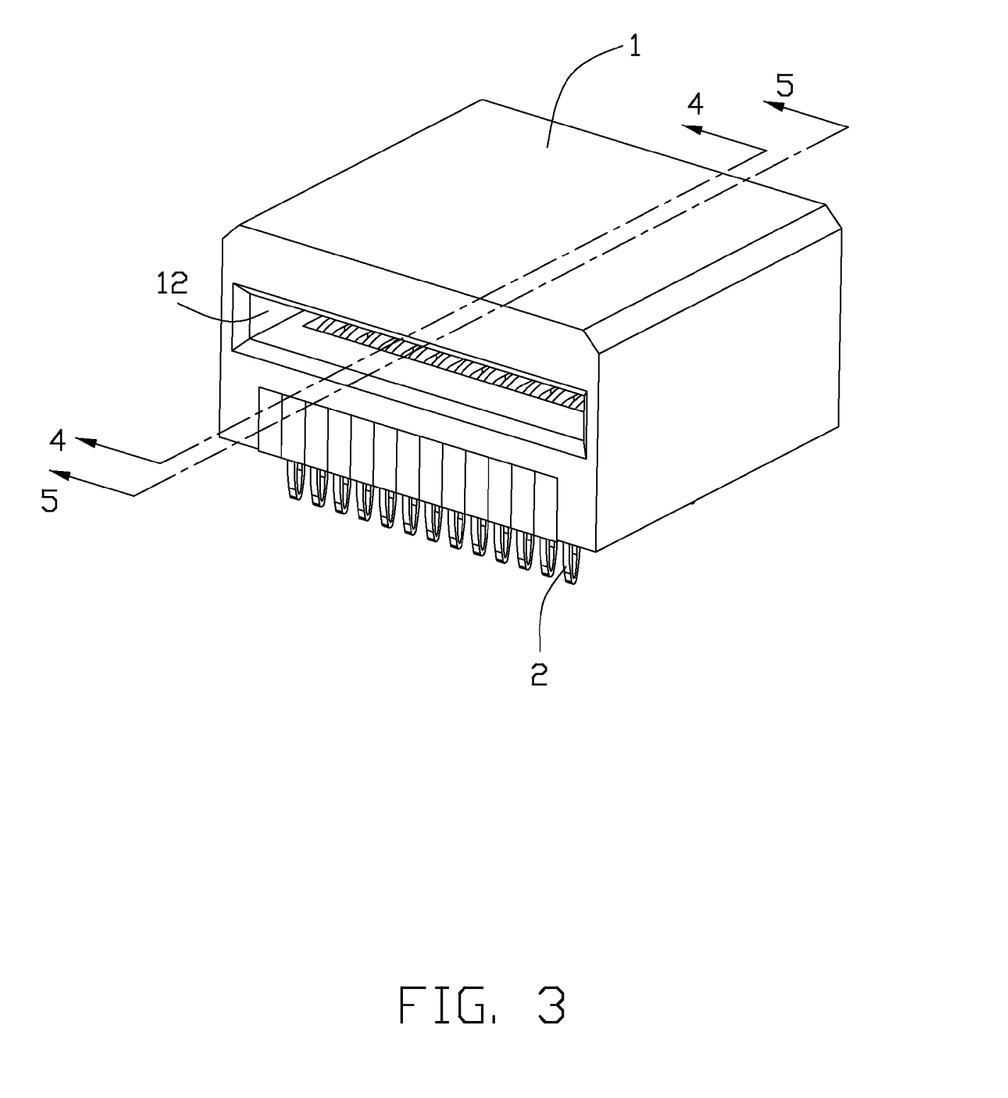
FIG. 3 is a perspective view showing contact modules mounted in a housing shown in FIG. 1.

Referring to FIGS. 1 to 3, the receptacle connector 100 comprises a housing 1, a plurality of contact modules 2 secured in the housing 1, and a shielding shell 3 attached to the housing 1.

Referring to FIG. 1, the housing 1 has a bar 11 and an inserting opening 12 above the bar 11.

Referring to FIGS. 1-4, the plurality of contact modules 2 comprise a plurality of first contact modules 22 and a plurality of second contact modules 21.

Each first contact module 22 includes a first wafer 220 made from insulative material, a first terminal 221, a second terminal 222, and a third terminal 223 mounted in the first wafer 220 by insert-molding.

The first terminal 221 includes a first contact portion 2211, a first mounting portion 2212, and a first connecting portion 2213 between the first contact portion 2211 and the first mounting portion 2212 and secured in the first wafer 220 along a substantially vertical direction.

The second terminal 222 includes a second contact portion 2221, a second mounting portion 2222, and a second connecting portion 2223 between the second contact portion 2221 and the second mounting portion 2222 and secured in the first wafer 220 along a substantially vertical direction. The first terminal 221 and the second terminal 222 are secured in the first wafer 220 at two secured positions farther from each other along the mating direction.

The third contact portion 2231 of the third terminal 223 is arranged in mirrored image with the second contact portion 2221 of the second terminal 222. The third terminal 223 includes a third contact portion 2231, a third mounting portion 2232, and a third connecting portion 2233 between the third contact portion 2231 and the third mounting portion 2232 and secured in the first wafer 220 along substantial vertical direction.

The first contact portion 2211 of the first terminal 221 and the third contact portion 2231 of the third terminal 223 have a first slot 224 defined therebetween. The first contact portion 2211 is disposed substantially horizontally above the first slot 224, and the second and the third contact portions 2221, 2231 are bent to extend generally horizontally below the first slot 224. The first contact portion 2211 and the third contact portion 2231 extend forwardly. The second contact portion 2221 of the second terminal 222 and the third contact portion 2231 of the third terminal 223 approach close to each other and have upper surfaces flush with each other. The first contact portion 2211 and the third contact portion 2231 are separated from each other. The second terminal 222 is disposed closer to the inserting opening 12, than the third terminal 223.

Figure 4:
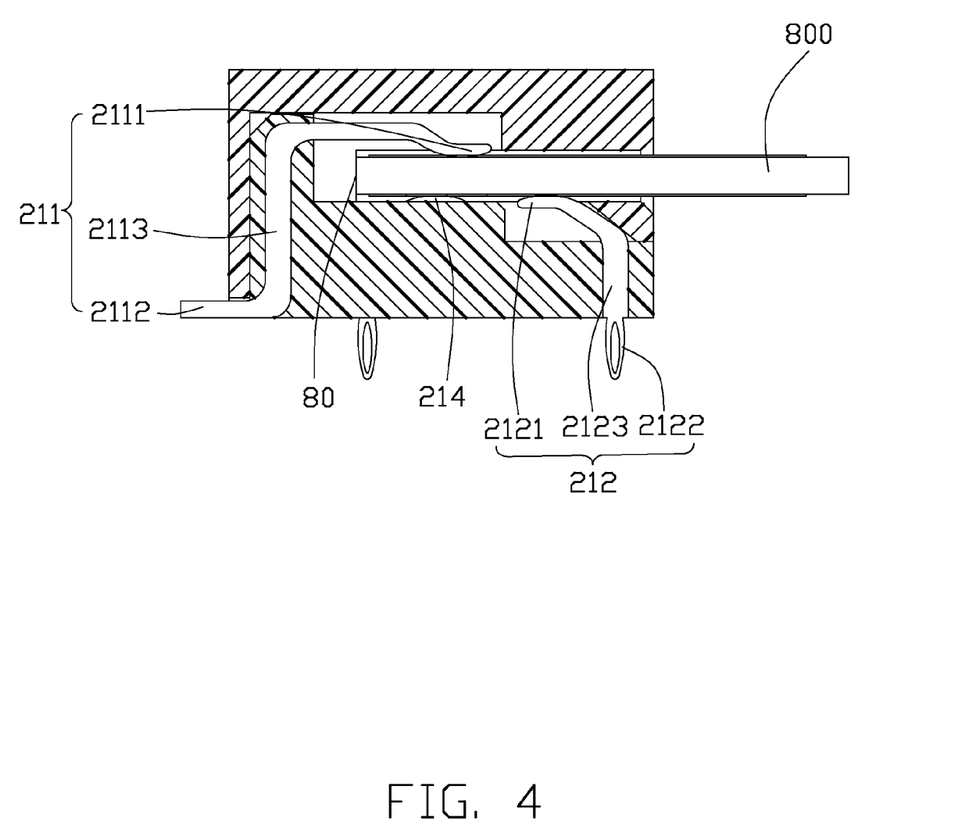
FIG. 4 is a cross-sectional view showing the second contact module in contact with a paddle board, taken along line 4-4 of FIG. 3, with a second wafer omitted.

Each second contact module 21 includes a second wafer 210 made from insulative material, a fourth terminal 211 and a fifth terminal 212 mounted in the second wafer 210 by insert-molding.

The fourth terminal 211 includes a fourth contact portion 2111, a fourth mounting portion 2112, and a fourth connecting portion 2113 between with the fourth contact portion 2111 and the fourth mounting portion 2112 and secured in the second wafer 210 along a substantial mating direction.

The fifth terminal 212 includes a fifth contact portion 2121, a fifth mounting portion 2122, and a fifth connecting portion 2123 between the fifth contact portion 2121 and the fifth mounting portion 2122 and secured in the second wafer 210 along substantial vertical direction. The fourth terminal 211 and the fifth terminal 212 are secured in the second wafer 210 at two secured positions separated from each other along the mating direction.

The fourth contact portion 2111 and the fifth contact portion 2121 have a second slot 214 defined therebetween. The fourth contact portion 2111 is disposed substantially horizontally above the second slot 214, and the fifth lower contact portion 2121 is bent to extend generally horizontally below the second slot 214. The fourth contact portion 2111 and the fifth contact portion 2121 approach close to each other along the mating direction. The fourth contact portion 2111 and the fifth contact portion 2121 are separated from each other along both the mating direction and the vertical direction, as shown in FIG. 4.

The shielding shell 3 has a mating opening 31 in front of the shielding shell 3 and a mounting opening 33 at a bottom of the shielding shell 3.

Referring to FIGS. 1-5, in assembling of the receptacle connector 100, one second contact module 21 and two first contact modules 22 are inserted into the housing 1 in sequence, with the second slot 214 and the first slots 224 aligned with the inserting opening 12. The housing 1 together with the contact modules 2 is mounted into the receiving cavity 32 of the shielding shell 3 through the mounting opening 33.

Figure 6:
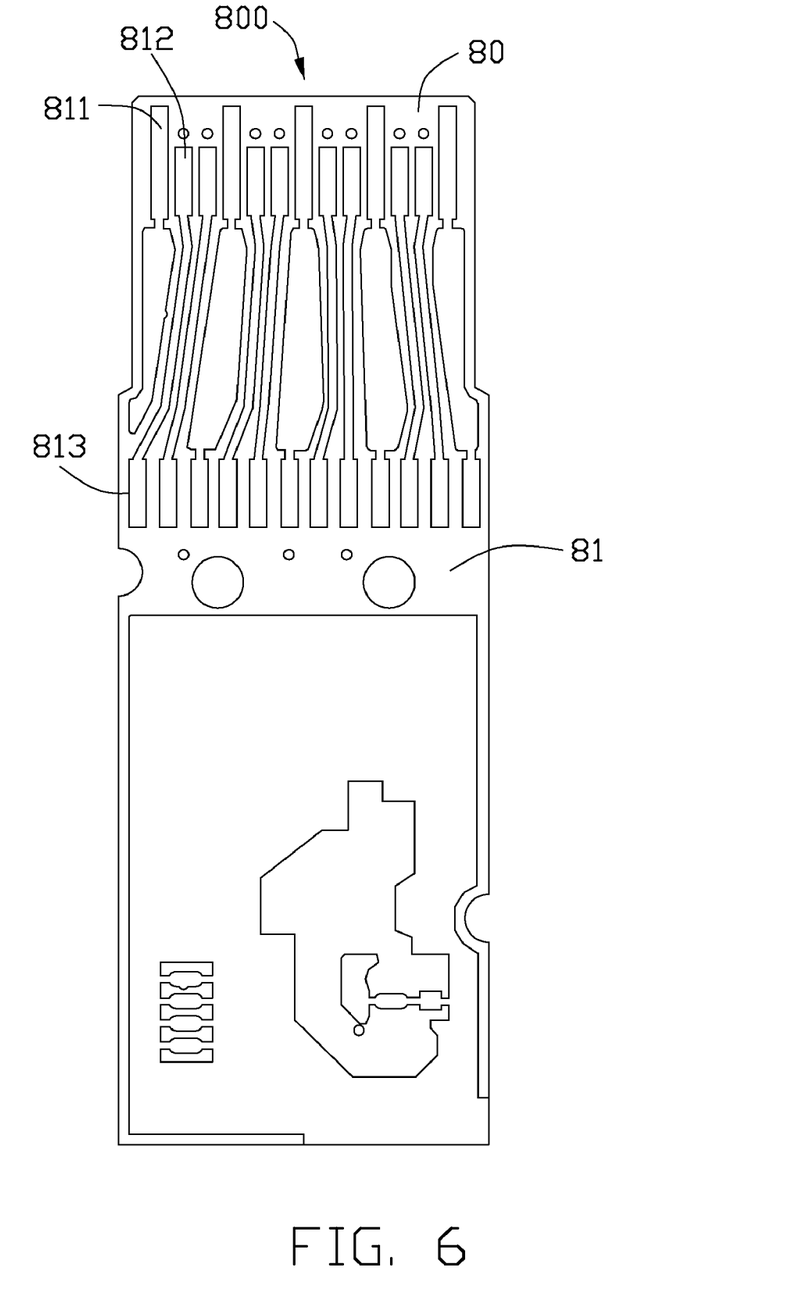
FIG. 6 is a perspective view showing an upper face of the paddle board.
Figure 7:
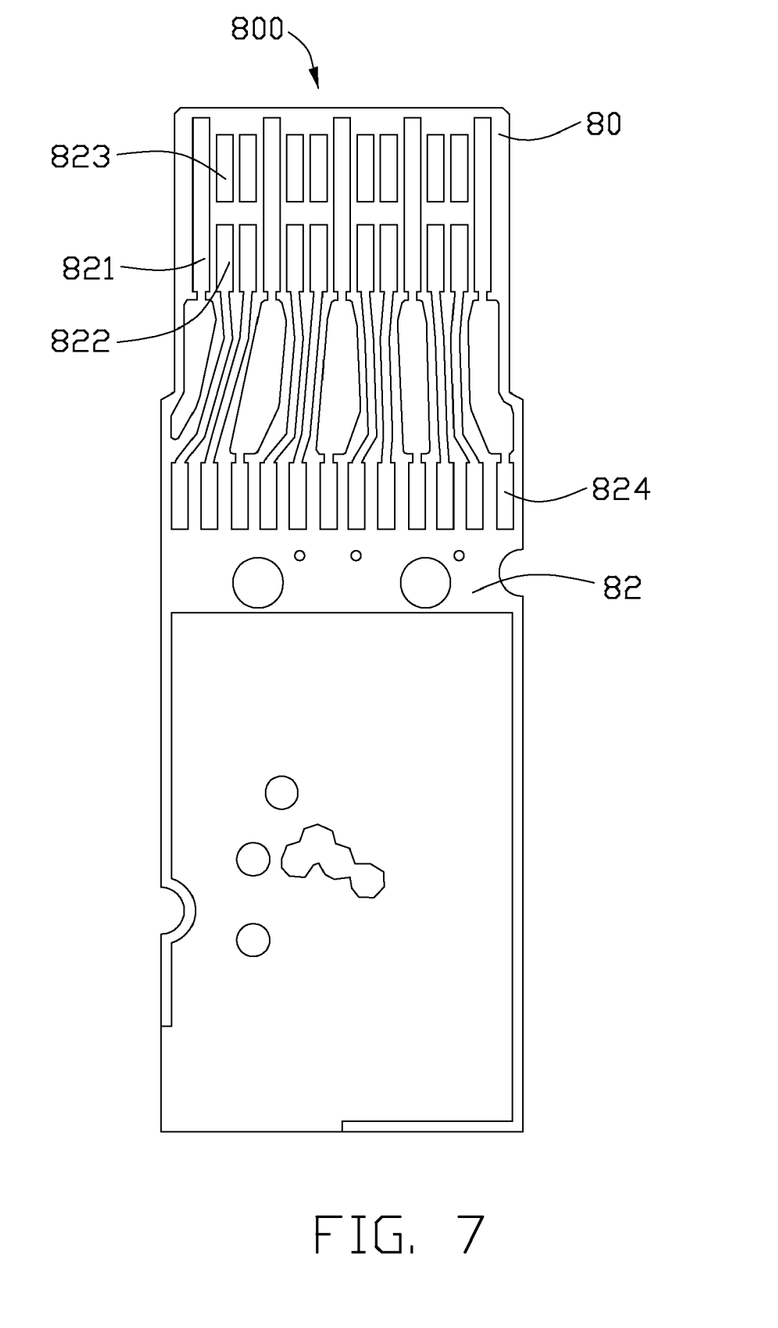
FIG. 7 is a perspective view showing a lower face of the paddle board referred in the first embodiment.

Referring to FIGS. 6 and 7, the paddle board 800 has a mating edge 80, an upper face or a first face 81, and a lower face or a second face 82 opposite to the upper face 81. The upper face 81 of the paddle board 800 includes five grounding pads 811 and four pairs of differential signal pads 812 arranged in one row adjacent to the mating edge 80, and a plurality of cable soldering pads 813 beyond the mating edge 80. Each grounding pad 811 has a length larger than that of the differential signal pads 812, and has a front end closer to the mating edge 80.

The lower face 82 of the paddle board 800 includes five grounding pads 821, four pairs of controlling pads 823 and four pairs of differential signal pads 822, and a plurality of cable soldering pads 824 beyond the mating edge 80. Each grounding pad 821 has a length larger than that of the controlling pad 823 or the differential signal pad 822, and has a front end closer to the mating edge 80. The pairs of controlling pads 823 are disposed closer to mating edge 80, than the pairs of differential signal pads 822. The controlling pads 823 could be formed into other low-frequency transmission pads.

The grounding pad 811 on the upper face 81 and corresponding grounding pads 821 on the lower face 82 are overlapped with each other. The differential signal pads 812 on the upper face 81 and corresponding differential signal pads 822 on the lower face 82 are partially overlapped with each other.

The partially overlapped differential signal pad 811 on the upper face 81, corresponding controlling pad 823 and corresponding differential signal pad 822 on the lower face 82 could be designated into first, second and third pads in a first group of pads. The partially overlapped grounding pad 811 on the upper face 81 and corresponding grounding pad 821 could be designated into a fourth and a fifth pad in a second group of pads.

When the receptacle connector 100 mates with the plug connector, the paddle board 800 is inserted into the receiving cavity 32 via the mating opening 31, and further inserted into the first slots 224 and the first slots 224 via the inserting opening 12.

Referring to FIGS. 4-7, the fourth contact portions 2111 of the fourth contacts 211 of the second contact modules 21 come to contact with the grounding pads 811 on the upper face 81 of the paddle board 800 to transmit grounding signals. The fifth contact portions 2121 of the fifth terminals 212 come to contact with the grounding pads 821 on the lower face 82 of the paddle board 800 for grounding. The pair of first contact portions 2211 of first terminals 22 of adjacent two first contact modules 22 come to contact with differential signal pads 812 on the upper face 81 of the paddle board 800 for transmitting differential signals. The pair of second contact portions 2221 of two adjacent second terminals 222 come to contact with differential signal pads 822 for transmitting differential signals. The pair of third contact portions 2231 of two adjacent third terminals 223 come to contact with two controlling pads 823 for transmitting controlling signal.

The first and fourth mounting portions 2212, 2112 extend along the mating direction for being mounted on the mother board 900 by SMT (Surface Mounted Technology) or extend downwardly for being mounted on the mother board 900 by press-fit. The second, third and fifth mounting portions 2222, 2232, 2122 extend along the mating direction for being mounted on the mother board 900 by SMT or extend downwardly for being mounted on the mother board 900 by press-fit.

The paddle board 800 is formed with more type and more number of conductive pads, to transmit more types of signals and establish grounding between two pairs of differential signals, without enlarging the dimension of the paddle board 800.

Figure 9:
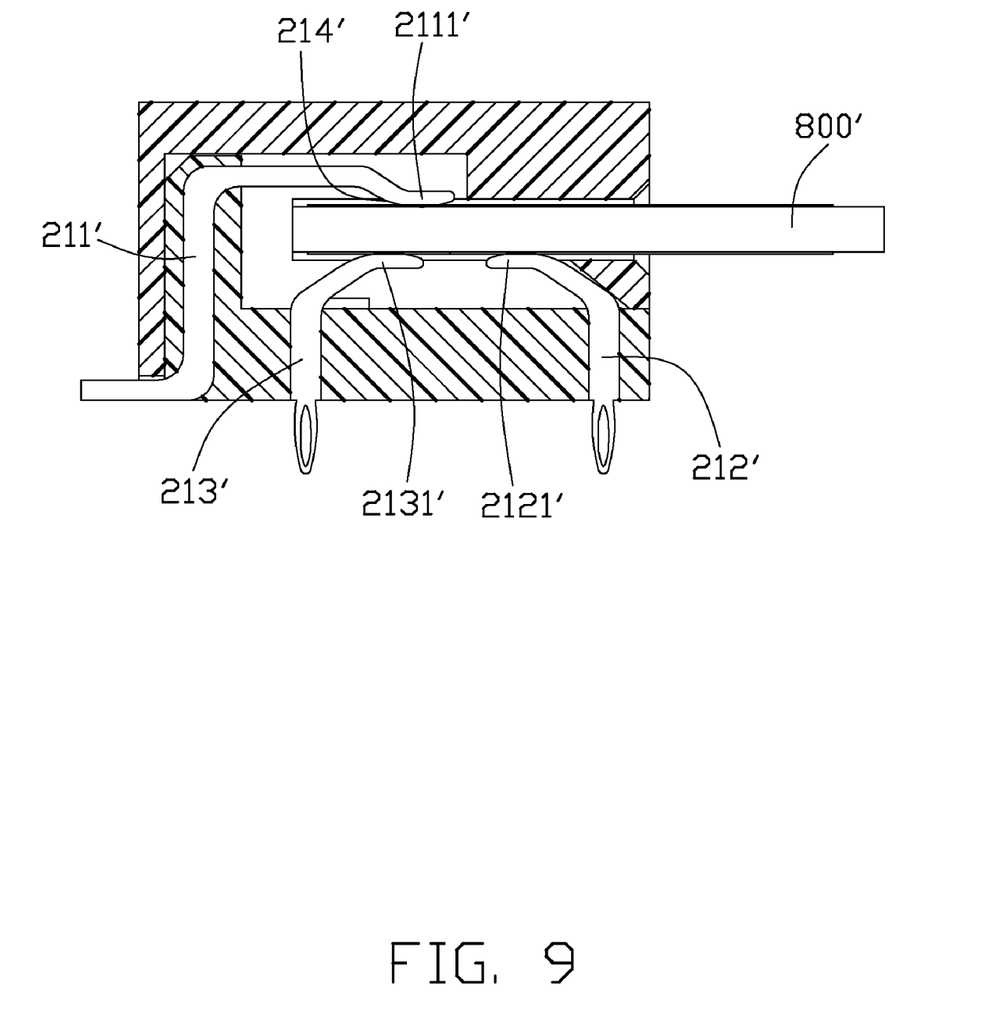
FIG. 9 is a cross-sectional view showing the second contact module in contact with a paddle board referred in the second embodiment, with the second wafer omitted.

In a second embodiment, the first contact module 22 is identical to that referred in the first embodiment. Referring to FIG. 9, the second contact module 21' in the second embodiment includes a fourth terminal 211' having a fourth contact portion 2111', a fifth terminal 212' having a fifth contact portion 2121', and a sixth terminal 213' having a sixth contact portion 2131'.

Figure 8:
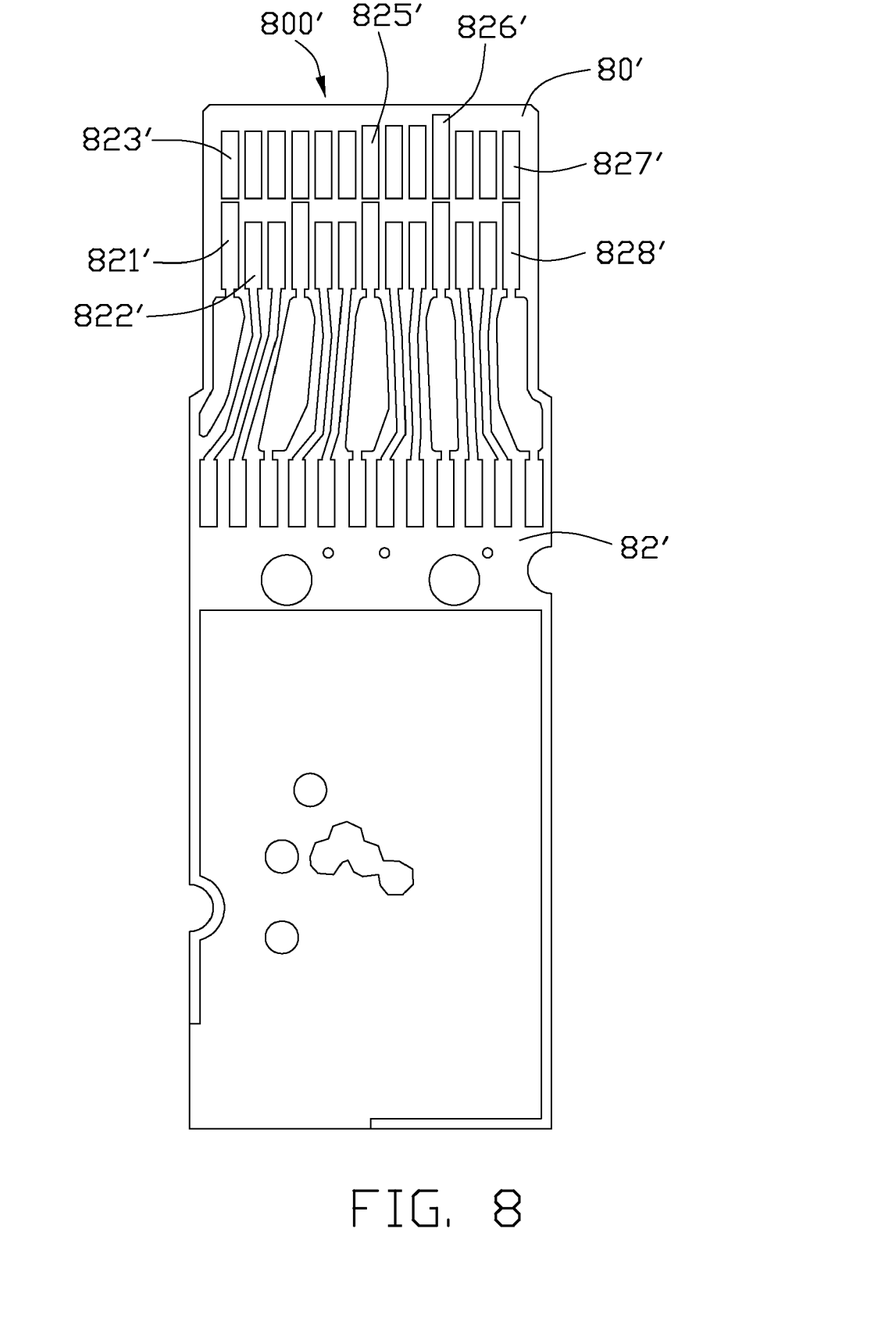
FIG. 8 is a perspective view showing the lower face of the paddle board referred in a second embodiment.

The upper face 81 of the paddle board 800' referred in the second embodiment is identical to that referred in the first embodiment shown in FIG. 6. Referring to FIG. 8, the lower face 82' of the paddle board 800' is formed with a second row of conductive pads 828' and a third row of conductive pads 827'. The third row of conductive pads 827' are disposed closer to the mating edge 80', compared to the second row of conductive pads 828'. The third row of conductive pads 827' include a plurality of controlling pads 823', power pads 825' and grounding pads 826'. The second row of conductive pads 828' include a plurality of grounding pads 821' and differential signal pads 822', with one pair of the differential signal pads 822' disposed between two grounding pads 821'.

The partially overlapped differential signal pad 811 on the upper face 81, corresponding controlling pad 823' and corresponding differential signal pad 822' on the lower face 82' could be designated into first, second and third pads in a first group of pads. The partially overlapped grounding pad 811 on the upper face 81, corresponding controlling pads 823', and corresponding grounding pad 821' could be designated into a fourth, a fifth and a sixth pad in a second group of pads.

When the paddle board 800' is inserted, the conductive pads on the upper face 81 of the paddle board 800' come to contact with the fourth terminals 211' and the first terminals 221. The third row of conductive pads 827' of the lower face 82' of the paddle board 800' come to contact with the second terminals 222 and the fifth terminals 212'. The second row of conductive pads 828' of the lower face 82' of the paddle board 800' come to contact with the third terminals 223 and the sixth terminals 213'.

The grounding pads 821' of the lower face 82' of the paddle board 800' in the second embodiment is designed into a shorter dimension than that of the grounding pads 821 in the first embodiment. The controlling pads 823' are formed closer to the mating edge 80', than the grounding pads 821'. The sixth terminals 213' come to contact with the controlling pads 823'. More number of differential signal pads and controlling pads could be formed in the paddle board 800'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A receptacle connector adapted for mating with a plug connector having a paddle board along a mating direction, comprising:
   a housing defining an inserting opening and a slot communicating with the inserting opening;
   a pair of first groups of terminals secured in the housing, each first group of terminals including a first terminal having a first contact portion for transmitting differential signal disposed at a first side of the slot, a second terminal having a second contact portion for transmitting low-frequency signal and a third terminal having a third contact portion for transmitting differential signal, said second contact portion and third contact portion being respectively disposed at a second side opposite to the first side of the slot and aligned with each other along the mating direction, said first contact portion being positioned between the second contact portion and the third contact portion along the mating direction; and
   a second group of terminals including a fourth terminal having a fourth contact portion for grounding disposed at the first side of the slot, and a fifth terminal having a fifth contact portion disposed at the second side of the slot, wherein one pair of the first groups of terminals and one second group of terminals are arranged in the housing in sequence along a transverse direction perpendicular to the mating direction, wherein said second contact portion of the second terminal is disposed closer to the inserting opening than the first contact portion, and said third contact portion of the third terminal is farther from the inserting opening than the first contact portion, wherein said fifth contact portion of the fifth terminal is disposed closer to the inserting opening than the fourth contact portion of the fourth terminal.

2. The receptacle connector as claimed in claim 1, wherein said second group of terminals include a sixth terminal having a sixth contact portion for grounding disposed at the second side of the slot and arranged in mirrored image with the fifth contact portion, said fifth terminal being provided for transmitting low-frequency signal.

3. A plug connector adapted for mating with a receptacle connector along a mating direction, comprising:
   a paddle board having a mating edge, a first face and a second face;
   a pair of first groups of pads, each first group of pads including a first pad for transmitting differential signal disposed on the first face, a second pad for transmitting low-frequency signal and a third pad for transmitting differential signal, said second and third pads being respectively disposed at the second face and aligned with each other along the mating direction, said first pad being positioned between the second pad and the third pad along the mating direction; and
   a second group of pads including a fourth pad for grounding on the first face, and a fifth pad disposed at the second face, wherein one fourth pad and a pair of first pads are arranged on the first face in sequence, and one fifth pad and a pair of second pads are arranged on the second face in sequence, wherein said second pad is disposed closer to the mating edge than the first pad, and the first pad is disposed closer to the mating edge than the third pad, with said first pad being partially overlapped with the third pad, wherein said fifth pad for grounding is disposed closer to the mating edge than the fourth pad, with the fifth pad partially overlapped with the fourth pad, wherein a pair of third pads are aligned with a pair of second pads along the mating direction and disposed farther from the mating edge than the pair of second pads.

4. The plug connector as claimed in claim 3, wherein said second group of pads include a sixth pad on the second face, said fifth pad being provided for transmitting low-frequency signal, said sixth pad being provided for grounding and aligned with the fifth pad along the mating direction and farther from the mating edge than the fifth pad.

5. An electrical connector adapted for mating with a plug connector having a paddle board along a mating direction, comprising:
a housing defining an inserting opening, a slot communicating with the inserting opening and defining an upper side and a lower side by two sides of the slot in a vertical direction;
a plurality of upper terminals being disposed on the upper side and categorized with differential pairs and grounding contacts in a way that one differential pair and one grounding contact alternately in sequence arranged with each other in a same row along a transverse direction perpendicular to said mating direction;
a plurality of lower terminals being disposed on the lower side, and categorized with differential pairs and grounding contacts in another way that two differential pairs and one grounding contact are alternately in sequence arranged in said transverse direction; wherein
the two differential pairs of the lower terminals are respectively arranged in two rows so as to result in two lower terminals belonging to the two differential pairs being aligned with each other in the mating direction for corresponding to two pads, which are aligned with each other in the mating direction, on the paddle board, while the grounding contacts of the lower terminals are arranged within only one in response to each of different positions in the mating direction for corresponding to one pad on the paddle board, further including first and second type wafers integrate the corresponding upper terminals and the lower terminals, wherein the first type wafer unifies one upper terminal and one lower terminal while the second type wafer unifies one upper terminal and two lower terminals, wherein the first type wafer unifies the grounding contacts while the second type wafer unifies the differential pairs.

* * * * *